US006984272B2

(12) United States Patent
Takahashi et al.

(10) Patent No.: US 6,984,272 B2
(45) Date of Patent: Jan. 10, 2006

(54) PROCESS FOR PRODUCING TITANIUM MATERIAL FOR TARGET, TITANIUM MATERIAL FOR TARGET, AND SPUTTERING TARGET USING THE SAME

(75) Inventors: Shoichi Takahashi, Chigasaki (JP); Takao Iwabuchi, Chigasaki (JP); Kensuke Ushijima, Chigasaki (JP)

(73) Assignee: Toho Titanium Co., Ltd., Chigasaki (JP)

( * ) Notice: Subject to any disclaimer, the term of this patent is extended or adjusted under 35 U.S.C. 154(b) by 178 days.

(21) Appl. No.: 10/341,558

(22) Filed: Jan. 14, 2003

(65) Prior Publication Data

US 2003/0132108 A1 Jul. 17, 2003

(30) Foreign Application Priority Data

Jan. 15, 2002 (JP) ............................ 2002-006307

(51) Int. Cl.
*C22F 1/18* (2006.01)

(52) U.S. Cl. ...................... 148/558; 148/670; 148/669; 148/559

(58) Field of Classification Search ........ 148/669–671, 148/557, 421; 204/298.13; 257/763
See application file for complete search history.

(56) References Cited

U.S. PATENT DOCUMENTS 6,210,502 B1 * 4/2001 Takahashi .................. 148/670

FOREIGN PATENT DOCUMENTS

| | | |
|---|---|---|
| JP | 06010107 | 1/1994 |
| JP | 08-269698 | * 10/1996 |
| JP | 09241842 | 9/1997 |
| JP | 11200024 | 7/1999 |
| JP | 11269621 | 10/1999 |

* cited by examiner

*Primary Examiner*—Roy King
*Assistant Examiner*—Lois Zheng
(74) *Attorney, Agent, or Firm*—Antonelli, Terry, Stout and Kraus, LLP.

(57) ABSTRACT

A titanium material for a target has a microstructure in which the grain size is small and uniform and also has a macrostructure of the surface of the titanium material which is non-patterned and is excellent in surface property. A titanium ingot in which Vacuum Arc Remelting or Electron Beam Melting is performed is roughly forged at a temperature from 700° C. up to the β transformation temperature, and is then forged for finishing at room temperature to 350° C., and is finally annealed.

3 Claims, 3 Drawing Sheets

Crystal structure of titanium material for target (average grain size: 27 μm)

Macrostructure of titanium billet in which one side of a square section is 300 mm Macrostructure of cylindrical titanium billet of 165 mm in diameter Crystal structure of titanium material for target (average grain size: 27 $\mu$m)

Macrostructure of titanium billet in which one side of a square section is 300 mm Macrostructure of cylindrical titanium billet of 165 mm in diameter Crystal structure of titanium material for target (average grain size: 27 $\mu$m)

PROCESS FOR PRODUCING TITANIUM MATERIAL FOR TARGET, TITANIUM MATERIAL FOR TARGET, AND SPUTTERING TARGET USING THE SAME

BACKGROUND OF THE INVENTION

1. Field of the Invention

The present invention relates to processes for producing titanium materials for targets, and particularly relates to processing methods for producing titanium materials for targets from high-purity titanium materials obtained by Vacuum Arc Remelting or Electron Beam Melting.

2. Description of Related Art

With developments in electronic components in recent years, titanium materials as barrier materials have been focused on for use in electronic components. In the titanium materials used in this field, contamination by impurities should be avoided as much as possible. Therefore, not only Fe, Ni, and Cr but also gas components such as oxygen and nitrogen, are to be restricted to the order of ppm.

However, in a process in which titanium is deposited on a substrate by irradiating an electron beam on a target material, although most of the titanium evaporated from the target reaches the substrate, some of the titanium adheres to inner surfaces of the sputtering apparatus. In the above process, a titanium particle (referred to as a "particle") may be formed, and the particle may reach the substrate and adhere thereto. Such particles have been believed to be undesirable since such particles may cause problems such as short circuiting in a circuit substrate in which the wiring thereon is being made finer and finer. Therefore, it has been desired to increase titanium yield and to avoid the production of such particles. As a technique for solving the above problems, Japanese Patent Application, First Publication, No. 241842/97 proposes to align crystal grains forming a target in a specific orientation to increase titanium yield. Japanese Patent Application, First Publication, No. 200024/99 proposes to restrict surface roughness of a target to a limited range, thereby inhibiting production of particles which are produced due to bumps and valleys.

In a titanium material as a raw material for a target, it is insufficient for only the macrostructure of the target to be uniform; it is also required that the microstructure of the target be fine and uniform. Specifically, it is necessary that the material for the target be produced by combining forging and annealing, etc., since it is difficult to use a titanium ingot as cast for the target because casting structures remain in a titanium ingot which has been subjected to Vacuum Arc Remelting or Electron Beam Melting.

In order to solve this problem, Japanese Patent Application, First Publication, No. 010107/94 proposes a process for producing titanium material for a target in which cast steel of titanium is subjected to hot forging, subjected to rolling at a temperature of 400° C. or less, and heat-treated at a temperature ranging from 500° C. to 650° C., to make the thickness of a thin film uniform. However, the technology shown in the reference is directed to finally obtaining a target material by the strip processing, and this technology is suitable only for a case in which raw material, of which the thickness is comparatively small, is processed. However, the strip processing is not suitable for processing of thick titanium blocks or ingots, and features by means such as the forging so as to be suitable features in this case have not been disclosed. In this publication, there are descriptions concerned with strip processing methods for cast steel after hot forging, but disclosure of temperature regulation of hot forging is not sufficient.

In addition, in recent years, demand for specific macrostructures and microstructures of titanium materials for targets continues and a process for producing a titanium material for a target to meet this demand is desired. In a conventional process for producing a titanium material, a titanium ingot is forged at a temperature which is a β transformation temperature or more, and next, by carrying out low-temperature forging and annealing, a titanium billet, in which the grain size is fine and is uniform, has been obtained. However, in this method, there is are cases in which circle-shaped or cross-shaped patterns, as shown in FIG. 2A, which seem to originate from the orientation of crystal structure, appeared on the surface of the macrostructure of the obtained titanium billet due to the forging being carried out at a temperature of the β transformation temperature or more. There is a case in which this pattern still remains, as shown in FIG. 2B, even if the surface of the titanium billet is polished after warm forging. Therefore, according to this method, it was possible to produce a titanium material for a target in which the grains size are fine and uniform in the microstructure as shown in FIG. 2C. However, there was a problem in that the properties as a target were degraded by the circle-shaped or cross-shaped pattern remaining on the surface in the macrostructure. Conditions for rationally solving such problems have still not been found, and the determination of specific condition is desired.

SUMMARY OF THE INVENTION

Thus, an object of the present invention is, in view of considering the above, to provide a process for producing titanium materials for targets, in which the microstructure has a fine grain size and is uniform, and in which the macrostructure of the surface of the titanium material is non-patterned and is superior in surface characteristics are combined, from the titanium ingot in which Electron Beam Melting or Vacuum Arc Remelting is produced, by combining a forging in a specific temperature range with annealing.

The inventors of this invention have extensively researched in order to solve the above problems, and have completed the present invention by finding that the macrostructure becomes uniform, and the microstructure also becomes uniform, by forging a high-purity titanium ingot obtained by Vacuum Arc Remelting or Electron Beam Melting in a temperature in a range under a β transformation temperature (880° C.), forging in a temperature range from room temperature to 350° C., and then annealing. The inventors of this invention found that the titanium material for the target produced by using a titanium ingot produced as described above is preferable for producing a sputtering target, that a sputtering target may be obtained by connecting a titanium material obtained in this way with a backing plate, generation of particles is slight, and that the target is suitable as a target for sputtering.

That is to say, a process for producing a titanium material for a target in a first aspect of the invention comprises a titanium ingot on which Vacuum Arc Remelting or Electron Beam Melting has been performed being roughly forged at temperature from 700° C. to less than the β transformation temperature, being forged for finishing at room temperature to 350° C., and then being annealed.

A process for producing a titanium material for a target according to a second aspect of the invention comprises a titanium ingot on which Vacuum Arc Remelting or Electron Beam Melting has been performed being roughly forged at temperature from 700° C. to less than the β transformation temperature under conditions in which the forging ratio is set from 1 to 10, then being forged for finishing at room temperature to 350° C. under conditions in which the forging ratio is set from 2 to 10, and finally being annealed.

A process for producing a titanium material for a target according to a third aspect of the invention comprising a titanium ingot in which Vacuum Arc Remelting has been performed being roughly forged at temperature from 700° C. to less than the β transformation temperature, then being forged for finishing at room temperature to 350° C., and finally being annealed at a temperature from 400° C. to 600° C.

A titanium material for a target according to a forth aspect of the invention comprising melting a titanium ingot by Vacuum Arc Remelting or Electron Beam Melting, roughly forging the titanium ingot at temperature from 700° C. up to the β transformation temperature while setting the forging ratio to be 1 to 10, forging for finishing the ingot at room temperature to 350° C. while setting the forging ratio to be 2 to 10, and annealing the ingot at a temperature from 400° C. to 600° C.

A titanium material for a target according to a fifth aspect of the invention, the material comprising melting titanium ingot by Vacuum Arc Remelting or Electron Beam Melting, roughly forging titanium ingot at temperature from 700° C. to under β transformation temperature, forging for finishing the ingot at room temperature to 350° C. and annealing the ingot.

A titanium material for a target according to a sixth aspect of the invention is a titanium material produced by a process according to one of the first to forth aspects of the invention, the titanium material having impurity components of Fe<15 ppm, Ni<15 ppm, Cr<5 ppm, Mn<5 ppm, Al<5 ppm, Si<5 ppm, Cu<5 ppm, and O<500 ppm.

A sputtering target according to a seventh aspect of the invention is a sputtering target produced by using a titanium material for a target according to a fifth aspect of the invention.

In the present invention, it is preferable that the forging ratio in rough forging be 1 to 10 and that the forging ratio in forging for finishing be 2 to 10. In addition, in this invention, it is preferable that annealing temperature be 400° C. to 600° C.

By using such a component, it is possible to supply a suitable titanium material from a high-purity titanium ingot obtained by Vacuum Arc Remelting or Electron Beam Melting to the target. The high-purity titanium referred to in the present invention indicates a titanium having a purity of 4N5 or over. Specifically, the high-purity titanium is a titanium having impurities of Fe<15 ppm, preferably Fe<10 ppm, and more preferably Fe<5 ppm; Ni<10 ppm, preferably Ni<5 ppm; Cr<5 ppm; Mn<5 ppm; Al<5 ppm; Si<5 ppm; Cu<5 ppm; and O<500 ppm, and preferably O<250 ppm.

As described above, it is preferable, in a melting process, to use the Electron Beam Melting in which contamination by air exposure in a treatment process is low, because an especially low carbon content in the titanium material is required in the present invention.

DESCRIPTION OF THE PREFERRED EMBODIMENTS

Figure 1A:
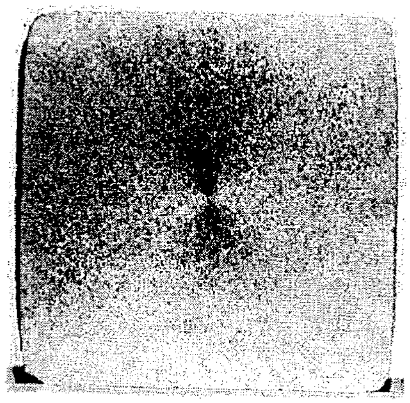
FIG. 1A is a photograph showing a macrostructure of a titanium billet in which rough forging was performed in a temperature range of the β transformation temperature or more and one side of a square section is 300 mm, in a process for producing a titanium material for a target of practical example 1 in the present invention.

Hereinafter, an embodiment of the present invention will be described.

Raw Material of Titanium Ingot

As a raw material of a titanium ingot, among lumps of sponge titanium produced by the crawl method, a material in which not only are proportions of Fe, Ni, and Cr for quality characteristic required in a target satisfied, but also proportions of oxygen and nitrogen, etc., are low, is chosen for the melted raw material.

Suitable Form for Each Process

Rough Forging

An ingot handled in rough forging is formed into a billet having a size which is almost equivalent to that of the material required for the target by forging, after the ingot is softened by heating to high temperature to begin with, since the diameter of the ingot is usually large. Although this rough forging is commonly performed in a high-temperature range above the β transformation temperature in which processing is easy, in the present invention, heating in the rough forging is performed in temperature range of 700° C. up to the β transformation temperature. By the rough forging in this temperature range, the forming of a circle-shaped or cross-shaped pattern macrostructure on the surface of the obtained titanium billet can be prevented, and therefore an excellent macrostructure is obtained. It is possible to forge even at relatively low temperatures, since the strength of the high-purity titanium ingot handled in the present invention is lower than one of alloys, etc. In addition, the effect, which promotes refinement of the crystal grain by promoting recrystallization in annealing process performed afterward, is also performed, because processing strain is also easy to be accumulated in the case in which the forging is performed at low temperatures.

It is preferable that the ingot used in the rough forging be subjected to a forging ratio of 1 to 10, more preferably, a forging ratio of 2 to 3. When the forging ratio in the rough forging is lower than the above-mentioned value, a casting structure of the titanium ingot remains, and it is necessary that the forging for finishing afterward be performed in a complicated manner. Conversely, although it is also possible to process the rough forging at or above the above-mentioned forging ratio, in this case, it is not economical.

It is suitable to use argon gas atmosphere as the forging atmosphere so as to suppress generation of oxides, but when considering manufacturing cost, it is possible to minimize the generation of scale by performing the forging carefully in the air. In response to need, the scale may be removed by cutting the surface of the billet after the forging.

Forging for Finishing

Next, the billet obtained by the rough forging is retained at a temperature range from room temperature to 350° C., and is forged for finishing up to a level which is approximately to the diameter necessary for the titanium material for a target. Although it is not necessary to specially heat the ingot before the forging for finishing, the forging for finishing can be smoothly promoted when the ingot is heated in the temperature range under 350° C. However, there are cases in which recrystallization afterward the annealing process is not sufficient, when the temperature of the forging for finishing is over 350° C. That is to say, it is possible for the processing strain to accumulate in the material by performing the forging for finishing at a relatively low temperature, and for refinement of the crystal grain to be carried out by releasing the processing strain in an annealing process afterward.

In the forging for finishing, it is preferable that the forging ratio be 2 to 10 in processing, more preferably, 3 to 5. In the case in which the forging ratio in the forging for finishing is less than the above-mentioned value, the refinement of the crystal grain in the annealing produced afterward cannot be promoted. Additionally, in the case in which the forging ratio in the forging for finishing is above the above-mentioned value, it is not preferable because there are cases in which cracks in titanium material occur.

Annealing

In the above manner, only when the forging for finishing is performed, the strain accumulates inside of the material; therefore, it is necessary to perform the annealing after the forging for finishing. It is preferable that the annealing be performed at temperature from 400 to 600° C. It is not preferable, since the strain accumulated inside the material is not sufficiently released, to perform this at a temperature range under the above-mentioned value, and since roughening of the crystal grain occurs in the temperature range above the above-mentioned value.

In addition, in the present invention, there are cases in which annealing temperature set in two steps is preferable. For example, the material may be maintained at the same temperature for fixed period after it is heated to 500° C., and that it be heated to 550° C. to be maintained for a fixed period. It is possible to obtain a titanium material for a target having a more uniform crystal grain by performing the above-mentioned gradual annealing. Although the diameter of the titanium material for the target in performing the annealing does not have any particular restriction if the titanium material can be annealed, it is preferable that the size in the diameter be about 200 to 400 mm when the ease of the heating annealing is considered.

It is more preferable that mirror finishing be conducted on the surface of the titanium material obtained by the aforesaid process by using lathes, etc. Afterwards, it is possible to constitute the target by adhesion of a backing plate. Since there are cases in which dirt, etc., remains at the surface of the titanium target constituted like this, it is preferable that the surface be cleaned by carrying out pickling, etc., before sputtering.

One preferable form is a titanium ingot obtained by Vacuum Arc Remelting or Electron Beam Melting roughly forged at a temperature from 700° C. up to the β transformation temperature, and next, the forging for finishing is performed on the ingot at room temperature to 350° C., and finally the annealing is performed on the ingot. Although the temperature in the rough forging is also based on the variability of the ingot as a raw material, a temperature from about 750 to 850° C. is preferable, and it is possible to effectively make fine bulky crystal grain which was manufactured by casting. Preferable temperature in the forging for finishing is in a range of the room temperature to 200° C., and it is possible to make fine the crystal grain by choosing this temperature range.

In a different form, a process for producing a titanium material for a target in the present invention has a titanium ingot in which Vacuum Arc Remelting or Electron Beam Melting is performed being roughly forged at a temperature from 700° C. up to the β transformation temperature in conditions of setting the forging ratio of 1 to 10, being forged for finishing at a room temperature to 350° C. in conditions of setting the forging ratio of 2 to 10, and next being annealed. It is preferable that the forging ratio in the rough forging be 2 to 3, and the forging ratio in the forging for finishing be 3 to 5, in order to obtain fine crystal grains.

Furthermore, in another form, a process for producing titanium material for target in the present invention has a titanium ingot in which Vacuum Arc Remelting or Electron Beam Melting is performed being roughly forged at temperature from 700° C. up to the β transformation temperature, next being forged for finishing at room temperature to 350° C., and finally being annealed at a temperature from 400 to 600° C. Preferable temperature range in the annealing is 300 to 500° C. It is possible to produce a suitable ingot as a target material having a fine and uniform crystal structure.

In another form, a process for producing a titanium material for a target in the present invention has titanium ingot in which Vacuum Arc Remelting or Electron Beam Melting being performed is roughly forged at a temperature from 700° C. up to the β transformation temperature in conditions of setting the forging ratio from 1 to 10, next being forged for finishing at room temperature to 350° C. in conditions of setting the forging ratio from 2 to 10, and finally being annealed at temperature from 400 to 600° C. In this form, it is preferable that the forging ratio in the rough forging be 2 to 3, and that the forging ratio in the forging for finishing be 3 to 5.

A titanium material for a target in the present invention has impurities of, Fe<15 ppm, Ni<15 ppm, Cr<15 ppm, Mn<15 ppm, Al<5 ppm, Si<5 ppm, Cu<5 ppm and O<500 ppm. It is preferable that the impurities be, Fe<10 ppm, Ni<10 ppm, Cr<10 ppm, Mn<10 ppm, Al<10 ppm and O<300 ppm, and more preferably, Fe<5 ppm, Ni<5 ppm, Cr<5 ppm. By setting such impurities, electrical characteristics of a thin film formed on the substrate by sputtering is excellent.

When titanium ingot produced in the above-mentioned process is sliced to a size suitable for the target, and is bonded to a backing plate, a sputtering target is obtained. It is preferable to use copper or aluminum alloy which is good in thermal characteristics for the backing plate, and that the backing plate be clamped with the titanium material for the target, be welded with the material, or be bonded through the bonding material. A thin film of high-purity titanium can be formed on electronic material substrates such as a ceramic, by sputtering equipment, by using the sputtering target united with the backing plate in this way.

It is also possible to form a thin film of high-purity titanium nitride by properly supplying nitrogen gas in the sputtering equipment and by using a technique of reactive sputtering.

EXAMPLES

Next, the effects of the present invention will be made clear according to the practical examples as follows.

Practical Example 1

A high-pure cylindrical titanium ingot made by Vacuum Arc Remelting (in which the components were as shown in Table 1) of 520 mm diameter was roughly forged at 850° C., a titanium billet in which one side of a square section was 300 mm was obtained.

Next, the forging for finishing was performed at 300° C., and a cylindrical titanium billet of 165 mm diameter was obtained. Afterward, one annealing was performed at 500° C. for 2 hours, and another annealing was performed at 525° C. for 4 hours and a titanium material for a target in the practical example 1 was thereby obtained. The forging ratio in the rough forging was 2.4, and the forging ratio in the forging for finishing was 4.2.

TABLE 1

(numbers in ppm)

| Ti | Fe | Ni | Cr | Mn | Al | Si | Sn | Cu | Na | K | O | C |
|---|---|---|---|---|---|---|---|---|---|---|---|---|
| Balance | 5 | 3 | <1 | <1 | <1 | <1 | <1 | <1 | <0.05 | <0.05 | 250 | 20 |

Figure 1B:
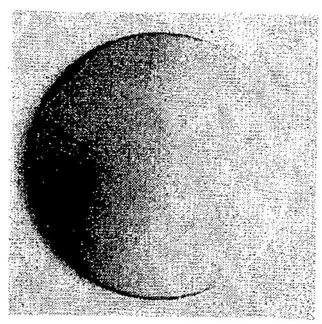
FIG. 1B is a photograph showing a macrostructure of a cylindrical titanium billet 165 mm in diameter in which warm forging was performed afterward.
Figure 1C:
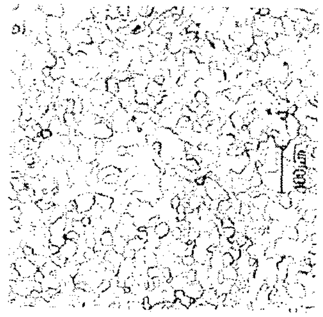
FIG. 1C is a photograph showing a crystal structure of a titanium material for a target obtained by the present invention.

In the above-mentioned production process, a titanium billet, in which one side of a square section was 300 mm, after the rough forging, is shown in FIG. 1A, a cylindrical titanium billet of 165 mm diameter in which polishing was also performed after the forging for finishing is shown in FIG. 1B, and the crystal structure of a titanium material for a target after the annealing is shown in FIG. 1C. As shown in the Figures, a titanium material for the target in the practical example 1 is uniform without having the circle-shaped or cross-shaped pattern on the surface in the macrostructure even after forging for finishing by roughly forging in a temperature range below the β transformation temperature, and furthermore, in microstructure of a titanium material for a target as an end product, the grain size was 27 μm and was fine and uniform.

Practical Example 2

After the columnar titanium material for the target produced in practical example 1 was sliced to 5 mm thickness, a sputtering target was obtained by bonding the material to a coppered backing plate. Titanium film was formed on alumina substrates by mounting the sputtering target obtained in this way for sputtering equipment. The formed titanium film was uniform, and peeling, etc., were not observed.

Comparative Example 1

A high-purity cylindrical titanium ingot obtained by Vacuum Arc Remelting which is equal to the melting in the practical example 1 (having components shown in Table 1) of 520 mm diameter was roughly forged at 950° C., and a titanium billet in which one side of a square section was 300 mm was obtained.

Next, the forging for finishing was performed at 300° C., and a cylindrical titanium billet of 165 mm diameter was obtained. Afterward, one annealing was performed at 500° C. for 2 hours, and another annealing was performed at 525° C. for 4 hours, and a titanium material for a target in the comparative example 1 was thereby obtained. The forging ratio in the rough forging was 2.4, and the forging ratio in the forging for finishing was 4.2.

Figure 2A:
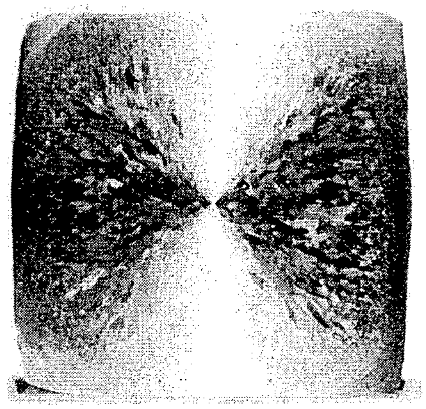
FIG. 2A is a photograph showing a macrostructure of a titanium billet in which rough forging was performed in a temperature range of the β transformation temperature or more and one side of a square section is 300 mm, in a conventional process for producing titanium material for target of comparative example 1.
Figure 2B:
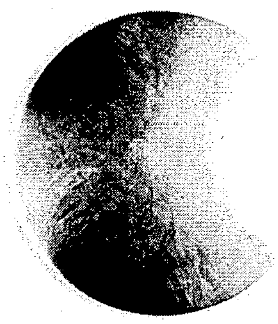
FIG. 2B is a photograph showing a macrostructure of a cylindrical titanium billet 165 mm in diameter in which warm forging was performed afterward.
Figure 2C:
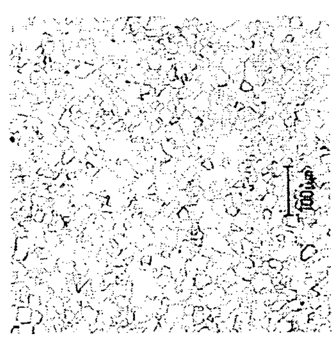
FIG. 2C is a photograph showing a crystal structure of a titanium material for a target obtained by the conventional process.
Figure 3A:
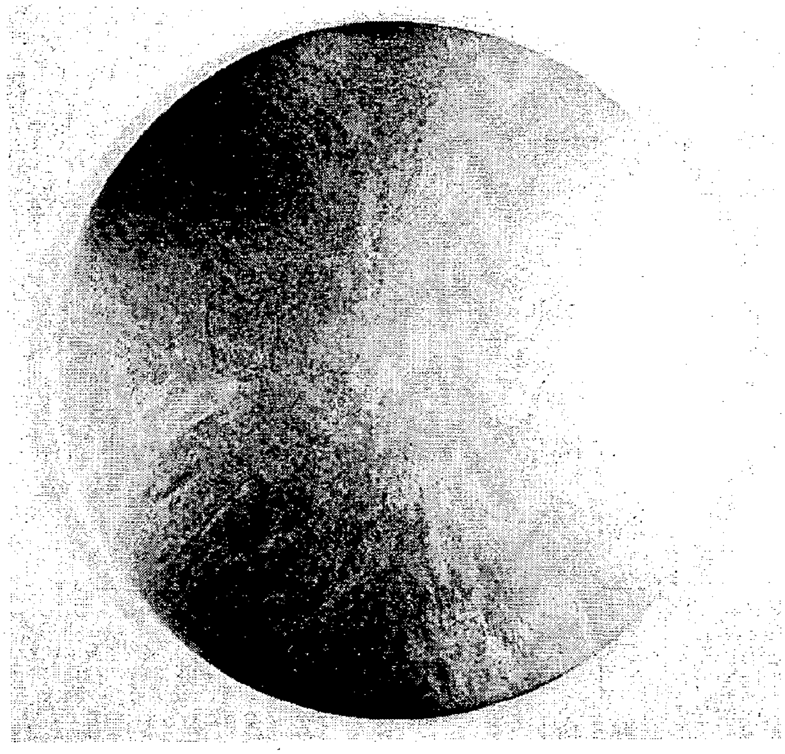
FIG. 3A is an enlargement of FIG. 2B.
Figure 3B:
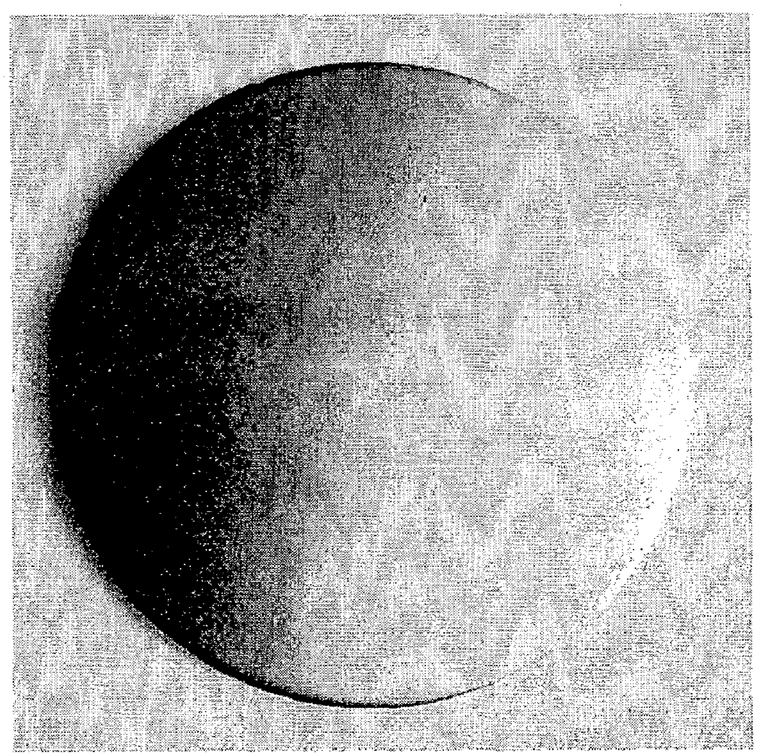
FIG. 3B is an enlargement of FIG. 1B.

In the above-mentioned production process, a titanium billet, in which one side of a square section was 300 mm, after the rough forging, is shown in FIG. 2A, a cylindrical titanium billet of 165 mm diameter in which polishing was also performed after the forging for finishing is shown in FIG. 2B, and the crystal structure of a titanium material for a target after the annealing is shown in FIG. 2C. As shown in FIG. 2C, a titanium material for the target in the comparative example 1 had a microstructure, which is fine (crystal size: 27 μm) and uniform, in the end product, but a pattern was formed on the surface of the macrostructure of the titanium billet in which one side of a square section is 300 mm after the rough forging, as shown in FIG. 2A, since the rough forging was performed in a temperature range of the β transformation temperature or more, furthermore, as shown in FIG. 2B, the pattern did not disappear after the forging for finishing.

Therefore, in the titanium material for a target in the comparative example 1, the grain size in the microstructure may have been suitable, but the circle-shaped or cross-shaped pattern, which seemed to originate from crystal orientation, was formed on the surface in the macrostructure, and therefore, the characteristics as a target material were insufficient for this titanium material.

What is claimed is:

1. A process for producing a titanium material for a target, the process comprising:

melting a titanium ingot by Vacuum Arc Remelting or Electron Beam Melting;

roughly forging the titanium ingot at a temperature from 700° C. up to the β transformation temperature while setting the forging ratio to be 2 to 3;

forging for finishing the ingot at room temperature to 350° C. while setting the forging ratio to be 3 to 5;

subjecting the ingot to a first anneal; and subsequently subjecting the ingot to a second anneal at a temperature higher than that of the first anneal.

2. A titanium material for a target, the material being produced by a process comprising:

melting titanium ingot by Vacuum Arc Remelting or Electron Beam Melting;

roughly forging titanium ingot at temperature from 700° C. to under β transformation temperature;

forging for finishing the ingot at room temperature to 350° C.; and annealing the ingot.

3. A titanium material for a target produced by a process described in claim 2, wherein impurities are Fe<15 ppm, Ni<15 ppm, Cr<5 ppm, Mn<5 ppm, Al<5 ppm, Si<5 ppm, Cu<5 ppm and O<500 ppm.

* * * * *